United States Patent
Albano et al.

(10) Patent No.: US 6,913,796 B2
(45) Date of Patent: Jul. 5, 2005

(54) PLASMA CURING PROCESS FOR POROUS LOW-K MATERIALS

(75) Inventors: Ralph Albano, Columbia, MD (US); Cory Bargeron, Midland, MI (US); Ivan L. Berry, III, Ellicott City, MD (US); Jeff Bremmer, Midland, MI (US); Phil Dembowski, Midland, MI (US); Orlando Escorcia, Falls Church, VA (US); Qingyuan Han, Columbia, MD (US); Nick Sbrockey, Gaithersburg, MD (US); Carlo Waldfried, Falls Church, VA (US)

(73) Assignees: Axcelis Technologies, Inc., Beverly, MA (US); Dow Corning Corporation, Midland, MI (US)

( * ) Notice: Subject to any disclaimer, the term of this patent is extended or adjusted under 35 U.S.C. 154(b) by 0 days.

(21) Appl. No.: 09/952,649

(22) Filed: Sep. 14, 2001

(65) Prior Publication Data

US 2002/0106500 A1 Aug. 8, 2002

Related U.S. Application Data

(63) Continuation-in-part of application No. 09/528,835, filed on Mar. 20, 2000, now Pat. No. 6,576,300, and a continuation-in-part of application No. 09/681,332, filed on Mar. 19, 2001, now Pat. No. 6,558,755.

(51) Int. Cl.[7] .......................... H05H 1/24; B05D 3/06; C08F 2/52; C08J 7/18

(52) U.S. Cl. ................. 427/536; 427/535; 427/539; 427/489; 438/788; 438/789

(58) Field of Search .................. 427/488, 489, 427/536, 535, 539, 397.7, 397.8, 493, 508, 510, 509, 515, 553, 554, 558; 438/788, 787, 789, 790

(56) References Cited

U.S. PATENT DOCUMENTS

| | | | |
|---|---|---|---|
| 3,615,272 A | 10/1971 | Collins et al. | |
| 4,636,440 A | 1/1987 | Jada | |
| 4,749,631 A | 6/1988 | Haluska et al. | |
| 4,756,977 A | 7/1988 | Haluska et al. | |
| 4,808,653 A | 2/1989 | Haluska et al. | |
| 4,822,697 A | 4/1989 | Haluska et al. | |
| 4,842,888 A | 6/1989 | Haluska et al. | |
| 4,847,162 A | 7/1989 | Haluska et al. | |
| 4,999,397 A | 3/1991 | Weiss et al. | |
| 5,008,320 A | 4/1991 | Haluska et al. | |
| 5,010,159 A | 4/1991 | Bank et al. | |
| 5,063,267 A | 11/1991 | Hanneman et al. | |
| 5,116,637 A | 5/1992 | Baney et al. | |
| 5,210,160 A | 5/1993 | Saive et al. | |
| 5,234,556 A * | 8/1993 | Oishi et al. | 427/561 |
| 5,262,201 A | 11/1993 | Chandra et al. | |
| 5,290,394 A | 3/1994 | Sasaki | |
| 5,416,190 A | 5/1995 | Mine et al. | |
| 5,523,163 A | 6/1996 | Ballance et al. | |
| 5,547,703 A | 8/1996 | Camilletti et al. | |
| 5,618,878 A | 4/1997 | Syktich et al. | |
| 5,853,808 A * | 12/1998 | Arkles et al. | 427/515 |
| 5,879,744 A * | 3/1999 | Cao et al. | 427/553 |
| 5,935,646 A * | 8/1999 | Raman et al. | 427/535 |
| 5,961,851 A | 10/1999 | Kamarehi et al. | |
| 6,054,206 A * | 4/2000 | Mountsier | 427/573 |
| 6,060,384 A * | 5/2000 | Chen et al. | 438/623 |
| 6,080,526 A * | 6/2000 | Yang et al. | 427/553 |
| 6,133,137 A * | 10/2000 | Usami | 438/782 |
| 6,143,360 A | 11/2000 | Zhong | |
| 6,149,987 A | 11/2000 | Perng et al. | |
| 6,159,842 A * | 12/2000 | Chang et al. | 438/702 |
| 6,184,260 B1 | 2/2001 | Zhong | |
| 6,231,989 B1 | 5/2001 | Chung et al. | |
| 6,232,424 B1 | 5/2001 | Zhong et al. | |
| 6,284,050 B1 * | 9/2001 | Shi et al. | 427/509 |
| 6,287,979 B1 * | 9/2001 | Zhou et al. | 438/692 |
| 6,313,045 B1 | 11/2001 | Zhong et al. | |
| 6,319,797 B1 * | 11/2001 | Usami | 438/510 |
| 6,359,096 B1 | 3/2002 | Zhong et al. | |
| 6,670,709 B2 * | 12/2003 | Usami | 257/758 |
| 6,759,098 B2 * | 7/2004 | Han et al. | 427/536 |
| 6,759,133 B2 * | 7/2004 | Berry et al. | 428/446 |
| 2001/0029283 A1 * | 10/2001 | Nakamura et al. | 525/100 |
| 2002/0136910 A1 * | 9/2002 | Hacker | 427/508 |
| 2003/0013311 A1 * | 1/2003 | Chang et al. | 438/704 |
| 2004/0198068 A1 * | 10/2004 | Yoshie | 438/781 |

FOREIGN PATENT DOCUMENTS

EP 1037275 9/2000

(Continued)

OTHER PUBLICATIONS

Abstract for JP 59–178749A to Takeda (Fujitsu), Oct. 1984.*
Abstract for JP 63–107122A to Fukuyama et al (Fujitsu), May 1988.*

(Continued)

Primary Examiner—Marianne Padgett
(74) Attorney, Agent, or Firm—Dinsmore & Shohl LLP

(57) ABSTRACT

Low dielectric constant porous materials with improved elastic modulus and hardness. The process of making such porous materials involves providing a porous dielectric material and plasma curing the porous dielectric material to produce a plasma cured porous dielectric material. Plasma curing of the porous dielectric material yields a material with improved modulus and hardness. The improvement in elastic modulus is typically greater than or about 50%, more typically greater than or about 100%, and more typically greater than or about 200%. The improvement in hardness is typically greater than or about 50%. The plasma cured porous dielectric material can optionally be post-plasma treated. The post-plasma treatment of the plasma cured porous dielectric material reduces the dielectric constant of the material while maintaining an improved elastic modulus and hardness as compared to the plasma cured porous dielectric material. The post-plasma treated, plasma cured porous dielectric material has a dielectric constant between about 1.1 and about 3.5 and an improved elastic modulus and hardness.

34 Claims, No Drawings

FOREIGN PATENT DOCUMENTS

| | | | |
|---|---|---|---|
| EP | 1189267 | | 3/2002 |
| JP | 59-178749 | | 10/1984 |
| JP | 60-086017 A | * | 5/1985 |
| JP | 63-107122 | | 5/1998 |
| WO | WO 0170628 | | 9/2001 |

OTHER PUBLICATIONS

Han Q. et al: "Ultra Low–K Porous Silicon Dioxide Films from a Plasma Process", Proceedings of the IEEE, International Interconnect Technology Conference, Jun. 4, 2001, pp. 171–173.

Kim J–J et al: "The Effects of Plasma Treatment on SiO2 Aerogel Film Using Various Reactive ($O_2$, $H_2$, $N_2$) and Non–Reactive (He, Ar) Gases", Thin Solid Films, Elsevier–Sequoia S.A. Lausanne, CH, vol. 377–378, Dec. 1, 2000, pp. 525–529.

Glasser et al.; Effect of the H20/TEOS Ratio Upon the Preparation and Nitridation of Silica Sol/Gel Films; Journal of Non–Crystalline SOlids; 1984; 13 pgs.; vol. 63; Elsevier Science Publishers B.V.; North–Holland, Amsterdam, no month.

* cited by examiner

PLASMA CURING PROCESS FOR POROUS LOW-K MATERIALS

CROSS-REFERENCE TO RELATED APPLICATIONS

This application is a continuation-in-part of U.S. patent application Ser. No. 09/528,835, filed Mar. 20, 2000, now U.S. Pat. No. 6,576,300 and entitled "HIGH MODULUS, LOW DIELECTRIC CONSTANT COATINGS" and U.S. patent application Ser. No. 09/681,332, filed Mar. 19, 2001, now U.S. Pat. No. 6,558,755 and entitled "PLASMA CURING PROCESS FOR POROUS SILICA THIN FILM", the disclosures of which are incorporated herein by reference.

BACKGROUND OF THE INVENTION

This invention relates generally to a process which is employed in manufacturing semiconductor chips. More particularly, the invention relates to a process for improving the structural properties of certain porous materials that are utilized as integrated circuit (IC) dielectrics.

New materials with low dielectric constants (known in the art as "low-k dielectrics") are being investigated for their potential use as insulators in semiconductor chip designs. A low dielectric constant material aids in enabling further reductions in integrated circuit feature dimensions. The substance with the lowest dielectric constant is air (k=1.0). Therefore, porous dielectrics are very promising candidates since they have the potential to provide very low dielectric constants. Unfortunately, such porous low-k dielectrics typically have the problem of insufficient mechanical strength.

Thin film dielectric coatings on electric devices are known in the art. For instance, U.S. Pat. Nos. 4,749,631 and 4,756,977, to Haluska et al., disclose silica based coatings produced by applying solutions of silicon alkoxides or hydrogen silsesquioxane, respectively, to substrates and then heating the coated substrates to a temperature between 200 and 1000° C. The dielectric constant of these coatings is often too high for certain electronic devices and circuits.

U.S. Pat. Nos. 4,847,162 and 4,842,888, to Haluska et al., teach the formation of nitrided silica coatings by heating hydrogen silsesquioxane resin and silicate esters, respectively, to a temperature between 200 and 1000° C. in the presence of ammonia. Glasser et al., Journal of Non-Crystalline Solids, 64 (1984) pp. 209–221, teaches the formation of ceramic coatings by heating tetraethoxysilane in the presence of ammonia. This reference teaches the use of anhydrous ammonia and that the resulting silica coatings are nitrided.

U.S. Pat. No. 4,636,440, to Jada, discloses a method of reducing the drying time for a sol-gel coated substrate comprising exposing the substrate to aqueous quaternary ammonium hydroxide and/or alkanol amine compounds. Jada requires that the coating be dried prior to heating. It is specifically limited to hydrolyzed or partially hydrolyzed silicon alkoxides.

U.S. Pat. No. 5,262,201, to Chandra et al., and U.S. Pat. No. 5,116,637. to Baney et al., teach the use of basic catalysts to lower the temperature necessary for the conversion of various preceramic materials, all involving hydrogen silsesquioxane, to ceramic coatings. These references teach the removal of solvent before the coating is exposed to the basic catalysts.

U.S. Pat. No. 5,547,703, to Camilletti et al., teaches a method for forming low dielectric constant Si—O containing coatings on substrates comprising heating a hydrogen silsesquioxane resin successively under wet ammonia, dry ammonia, and oxygen. The resultant coatings have dielectric constants as low as 2.42 at 1 MHz. This reference teaches the removal of solvent before converting the coating to a ceramic.

U.S. Pat. No. 5,523,163, to Balance et al., teaches a method for forming Si—O containing coatings on substrates comprising heating a hydrogen silsesquioxane resin to convert it to a Si—O containing ceramic coating and then exposing the coating to an annealing atmosphere containing hydrogen gas. The resultant coatings have dielectric constants as low as 2.773. The reference teaches the removal of solvent before converting the coating to a ceramic.

U.S. Pat. No. 5,618,878, to Syktich et al., discloses coating compositions containing hydrogen silsesquioxane resin dissolved in saturated alkyl hydrocarbons useful for forming thick ceramic coatings. The alkyl hydrocarbons disclosed are those up to dodecane. The reference does not teach exposure of the coated substrates to basic catalysts before solvent removal.

U.S. Pat. No. 6,231,989, to Chung et al., entitled "METHOD OF FORMING COATINGS" discloses a method of making porous network coatings with low dielectric constants. The method comprises depositing a coating on a substrate with a solution comprising a resin containing at least 2 Si—H groups and a solvent in a manner in which at least 5 volume % of the solvent remains in the coating after deposition. The coating is then exposed to an environment comprising a basic catalyst and water. Finally, the solvent is evaporated from the coating to form a porous network. If desired, the coating can be cured by heating to form a ceramic. Films made by this process have dielectric constants in the range of 1.5 to 2.4 with an elastic modulus between about 2 and about 3 GPa.

As was described in U.S. patent application Ser. No. 09/681,332, entitled "PLASMA CURING PROCESS FOR POROUS SILICA THIN FILM" and incorporated herein by reference, instead of thermally curing and plasma treating, porous network coatings produced from a resin containing at least 2 Si—H groups can be plasma cured, eliminating the need for prior furnace curing.

However, there remains a need for a process for making a porous low-k material with improved structural properties, such as an improved elastic modulus, without compromising or deteriorating its electrical properties.

SUMMARY OF THE INVENTION

The present invention meets that need by providing a process that produces materials having a low dielectric constant and an improved elastic modulus. The process involves providing a porous dielectric material having a first dielectric constant, having a first elastic modulus, and having a first film hardness, wherein the porous dielectric material is not a porous methylsilsesquioxane-based dielectric material. By "methylsilsesquioxane-based dielectric material" we mean a dielectric material that comprises 100% methylsilsesquioxane resins, and not a mixed methylsilsesquioxane/hydrogen silsesquioxane dielectric material, or any other mixed dielectric material which includes less than 100% methylsilsesquioxane resins. The porous dielectric material is plasma cured to produce a plasma cured porous dielectric material having a second dielectric constant which is comparable to or greater than the first dielectric constant, having a second elastic modulus which is greater than the first elastic modulus, and having a second film hardness which is greater than the first film hardness. By "comparable to" we mean both equal to and slightly less than, such as a second dielectric constant which is not more than 0.05 less than the first dielectric constant. The increase in elastic modulus is typically greater than or about 50%, more typically greater than or about 100%, and more typically greater than or about 200%.

The plasma cured porous dielectric material can optionally be post-plasma treated to provide a post-plasma treated, plasma cured porous dielectric material having a third dielectric constant, having a third elastic modulus, and having a third film hardness. Post-plasma treatment of the plasma cured porous dielectric material in some cases reduces the dielectric constant of the material while maintaining the increase in the elastic modulus and film hardness, as compared to the elastic modulus and film hardness before the post-plasma treatment.

Accordingly, it is an object of the present invention to produce porous dielectric materials having improved elastic modulus and material hardness, and a low dielectric constant.

DETAILED DESCRIPTION OF THE INVENTION

The present invention is based on the discovery that plasma curing virtually any porous dielectric material, without the necessity of thermally curing the material, increases the elastic modulus (Young's modulus) and material hardness of the material while maintaining its low dielectric constant properties. The porous dielectric material can include, but is not limited to, hydrogen silsesquioxane (HSQ) dielectric materials, mixed HSQ/methylsilsesquioxane (MSQ) dielectric materials, organic dielectric materials, inorganic dielectric materials, and combinations thereof, which can be produced by spin-on or chemical vapor deposition (CVD) processes. The porous dielectric materials can have porogen-generated, solvent-based, or molecular engineered pores, which may be distributed random or ordered, such as vertical pores.

Plasma curing can for some materials generate a notable amount of polar species in the porous dielectric material, which can be undesirable in some applications. The present invention is also based on the discovery that applying thermal, UV, or a second plasma treatment can remove these generated polar species resulting in a material with a low dielectric constant, and of equal or further improved elastic modulus and film hardness.

The process of the present invention is particularly applicable to the deposition of coatings on electronic devices or electronic circuits where they can serve as interlevel dielectric layers, doped dielectric layers to produce transistor-like devices, pigment loaded binder systems containing silicon to produce capacitor and capacitor-like devices, multilayer devices, 3-D devices, silicon on insulator devices, super lattice devices, and the like. However, the choice of substrates and devices to be coated by the instant invention is limited only by the need for thermal and chemical stability of the substrate at the temperature and pressure used in the present invention. As such, the porous dielectric materials of the present invention can be used on substrates such as plastics including, for example, polyimides, epoxies, polytetrafluoroethylene and copolymers thereof, polycarbonates, acrylics and polyesters, ceramics, leather, textiles, metals, and the like.

As used in the present invention, the expression "ceramic" includes ceramics such as amorphous silica and ceramic-like materials such as amorphous silica-like materials that are not fully free of carbon and/or hydrogen but are otherwise ceramic in character. The expressions "electronic device" or "electronic circuit" include, but are not limited to, silica-based devices, gallium arsenide based devices, silicon carbide based devices, focal plane arrays, opto-electronic devices, photovoltaic cells, and optical devices.

A porous dielectric material is needed as a starting material for the present invention. Typical HSQ-based dielectric materials for use with the present invention include FOx HSQ-based dielectric material and XLK porous HSQ-based dielectric material available from Dow Corning Corporation (Midland, Mich.). In addition, typical ultra low-k porous dielectric MSQ-based materials, made by spin-on processing, for use with the present invention are available from Chemat Technology, Inc. (Northridge, Calif.) and JSR Corporation (Tokyo, Japan).

The production of typical porous dielectric materials for use with the present invention is well known in the art. One process of making such a porous dielectric material is the porous network coating disclosed in U.S. Pat, No. 6,231,989, which is incorporated herein by reference for its teaching on how to produce porous dielectric materials having ultra low dielectric constants. The patent describes the manufacture of ultra low dielectric constant coatings having a dielectric constant of between about 1.5 and about 2.4, in which pores are introduced into HSQ-based films. HSQ-based films produced according to the process taught in U.S. Pat. No. 6,231,989, which have been cured under thermal conditions, contain about 20 to about 60% Si—H bonds density. When the dielectric constant of the coating is about 2.0, the coating has an elastic modulus of between about 2 and about 3 GPa.

The following method of producing a porous network coating is provided as an example of the production of a typical porous dielectric material. It is not the inventors' intent to limit their invention to only HSQ-based films. The process of the present invention is applicable to virtually any porous dielectric material.

The method of producing the HSQ-based porous network coating starts with depositing a coating on a substrate with a solution comprising a resin containing at least 2 Si—H groups and a solvent. The resins containing at least 2 Si—H groups are not particularly limited, as long as the Si—H bonds can be hydrolyzed and at least partially condensed by the basic catalyst and water to form a cross-linked network that serves as the structure for the porous network. Generally, such materials have the formula:

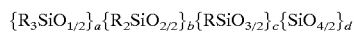

$$\{R_3SiO_{1/2}\}_a\{R_2SiO_{2/2}\}_b\{RSiO_{3/2}\}_c\{SiO_{4/2}\}_d$$

wherein each R is independently selected from the group consisting of hydrogen, alkyl, alkenyl, or aryl groups, or alkyl, alkenyl, or aryl groups substituted with a hetero atom such as a halogen, nitrogen, sulfur, oxygen, or silicon, and a, b, c, and d are mole fractions of the particular unit and their total is 1, with the proviso that at least 2 R groups per molecule are hydrogen and the material is sufficiently resinous in structure to form the desired network. Examples of alkyl groups are methyl, ethyl, propyl, butyl, and the like, with alkyls of 1–6 carbons being typical. Examples of alkenyl groups include vinyl, allyl, and hexenyl. Examples of aryls include phenyl. Examples of substituted groups include $CF_3(CF_2)_nCH_2CH_2$, where n=0–6.

Useful in the present invention are various hydridosiloxane resins, known as hydrogen silsesquioxane resins, comprising units of the formula $HSi(OH)_x(OR')_yO_{z/2}$. In this formula, each R' is independently selected from the group consisting of alkyl, alkenyl, or aryl groups, or alkyl, alkenyl, or aryl groups substituted with a hetero atom such as a halogen, nitrogen, sulfur, oxygen, or silicon. Examples of alkyl groups are methyl, ethyl, propyl, butyl, and the like, with alkyls of 1–6 carbons being typical. Examples of alkenyl groups include vinyl, allyl, and hexenyl. Examples of aryls include phenyl. Examples of substituted groups include $CF_3(CF_2)_nCH_2CH_2$, where n=0–6. When these R' groups are bonded to silicon through the oxygen atom, they form a hydrolyzable substituent. In the above formula, x=0 to 2, y=0 to 2, z=1 to 3, and x+y+z=3. These resins may be essentially fully condensed $(HSiO_{3/2})_n$ where n is 8 or greater, or they may be only partially hydrolyzed (i.e., containing some Si—OR'), and/or partially condensed (i.e., containing some Si—OH).

The structure of the resin containing at least 2 Si—H groups is not limited. The structure may be what is generally known as ladder-type, cage-type, or mixtures thereof. The HSQ resins may contain endgroups such as hydroxyl groups, triorganosiloxy groups, diorganohydrogensiloxy groups, trialkoxy groups, dialkoxy groups, and others. The HSQ resin may also contain a small number (e.g., less than 10%) of the silicon atoms, which have either 0 or 2 hydrogen atoms attached thereto and/or a small number of Si—C groups, such as $CH_3SiO_{3/2}$ or $HCH_3SiO_{2/2}$ groups.

The resins containing at least 2 Si—H groups and processes for their production are known in the art. For example, U.S. Pat. No. 3,815,272, to Collins et al., teaches the production of an essentially fully condensed hydrogen silsesquioxane resin (which may contain up to 100–300 ppm silanol) by a process comprising hydrolyzing trichlorosilane in a benzenesulfonic acid hydrate hydrolysis medium, and then washing the resulting resin with water or aqueous sulfuric acid. Similarly, U.S. Pat. No. 5,010,159, to Bank et al., teaches a process comprising hydrolyzing hydridosilanes in an arylsulfonic acid hydrate hydrolysis medium to form a resin which is then contacted with a neutralizing agent.

Other hydridosiloxane resins, such as those described in U.S. Pat. No. 4,999,397, to Weiss et al., and U.S. Pat. No. 5,210,160, to Salve et al., those produced by hydrolyzing an alkoxy or acyloxy silane in an acidic, alcoholic hydrolysis medium, those described in Japanese Kokai Patent Nos. 59-178749, 60-086017, and 63-107122, or any other equivalent hydridosiloxanes, will also function herein.

Specific molecular weight fractions of the Si—H containing resins may also be used. Such fractions and methods for their preparation are taught in U.S. Pat. No. 5,063,267, to Hanneman et al., and U.S. Pat. No. 5,416,190, to Mine et al., A typical fraction comprises material wherein at least 75% of the polymeric species have a number average molecular weight above about 1200, and a more typical fraction comprises material wherein at least 75% of the polymeric species have a number average molecular weight between about 1200 and about 100,000.

The Si—H containing resins may contain other components as long as these components do not interfere with the integrity of the coating. It should be noted, however, that certain materials may increase the dielectric constant of the coating.

Ceramic oxide precursors may also be used in combination with the Si—H containing resins. The ceramic oxide precursors useful herein include compounds of various metals such as aluminum, titanium, zirconium, tantalum, niobium and/or vanadium, as well as various non-metallic compounds, such as those of boron or phosphorus, which may be dissolved en solution, hydrolyzed, and subsequently pyrolyzed at relatively low temperature to form ceramic oxides. Ceramic oxide precursors useful herein are described in U.S. Pat. Nos. 4,808,653 and 5,008,320 to Haluska et al., and U.S. Pat. No. 5,290,394 to Sasaki.

The Si—H containing resins are applied to the substrates as solvent dispersions to form a coating on the substrate ("SiH resin coating"). Solvents that may be used include any agent or mixture of agents that will dissolve or disperse the resin to form a homogeneous liquid mixture without affecting the resulting coating or the substrate. These solvents can include alcohols, such as ethyl alcohol or isopropyl alcohol; aromatic hydrocarbons, such as benzene or toluene; branched or linear alkanes, such as n-heptane, dodecane, or nonane; branched or linear alkenes, such as n-heptene, dodecene, or tetradecene; ketones, such as methyl isobutyl ketone; esters; ethers, such as glycol ethers; or linear or cyclic siloxanes, such as hexamethyldisiloxane, octamethyldisiloxane, and mixtures thereof, or cyclic dimethylpolysiloxanes; or mixtures of any of the above solvents. The solvent is generally present in an amount sufficient to dissolve/disperse the resin to the concentration desired for application. Typically, the solvent is present in an amount of about 20 to about 99.9 wt %, and more typically from about 70 to about 95 wt %, based on the weight of the resin and solvent.

If desired, other materials can be included in the resin dispersion. For instance, the dispersion can include fillers, colorants, adhesion promoters, and the like.

Specific methods for application of the resin dispersion to the substrate include, but are not limited to, spin coating, dip coating, spray coating, flow coating, screen printing, or others. A typical method is spin coating.

At least about 5 volume % of the solvent should remain in the SiH resin coating until the resin is contacted with the basic catalyst and water. This solvent forms the pores of the porous network coating as the Si—H bonds are hydrolyzed and condensed. In some embodiments, it may be typical that at least about 10 volume % solvent remains, while in others, it may be typical that at least about 15 volume % solvent remains, and in still others, it may be typical that at least about 25 volume % solvent remains.

The method of retaining the solvent is not particularly restricted. In a typical embodiment, a high boiling point solvent can be used alone or as a co-solvent with one of the solvents described above. In this manner, processing the resin dispersion as described above under normal conditions allows for at least about 5% residual solvent remaining. Typical high boiling solvents in this embodiment are those with boiling points above about 175° C. including hydrocarbons, aromatic hydrocarbons, esters, ethers, and the like. Examples of specific solvents which can be used in this embodiment include saturated hydrocarbons, such as dodecane, tetradecane, hexadecane, etc., unsaturated hydrocarbons, such as dodecene, tetradecene, etc., xylenes, mesitylene, 1-heptanol, dipentene, d-limonene, tetrahydrofurfuryl alcohol, mineral spirits, 2-octanol, stoddard solvent, Isopar H™, diethyl oxalate, diamyl ether, tetrahydropyran-2-methanol, lactic acid butyl ester, isooctyl alcohol, propylene glycol, dipropylene glycol monomethyl ether, diethylene glycol diethyl ether, dimethyl sulfoxide, 2,5-hexanedione, 2-butoxyethanol acetate, diethylene glycol monomethyl ether, 1-octanol, ethylene glycol, Isopar L™, dipropylene glycol monomethyl ether acetate, diethylene glycol monoethyl ether, N-methylpyrrolidone, ethylene glycol dibutyl ether, gamma-butyrolactone, 1,3-butanediol, diethylene glycol monomethyl ether acetate, trimethylene glycol, triethylene glycol dimethyl ether, diethylene glycol monoethyl ether acetate, alpha-terpineol, n-hexyl ether, kerosene, 2-(2-n-butoxyethoxy)ethanol, dibutyl oxalate, propylene carbonate, propylene glycol monophenyl ether, diethylene glycol, catechol, diethylene glycol monobutyl ether acetate, ethylene glycol monophenyl ether, diethylene glycol dibutyl ether, diphenyl ether, ethylene glycol monobenzyl ether, hydroquinone, sulfolane, and triethylene glycol. Hydrocarbon solvents are particularly preferred.

The above processing (i.e., primarily deposition of the SiH resin coating solution) can be done in an environment that inhibits solvent evaporation prior to contact with the basic catalyst and water. For example, the spin coating can be performed in a closed environment such that the subsequent steps (i.e., contact with the basic catalyst and water) can occur before the solvent is completely evaporated.

The SiH resin coating containing at least about 5 volume % solvent is then contacted with a basic catalyst and water. Examples of basic catalysts include ammonia, ammonium hydroxide, as well as amines. The amines useful herein may include primary amines ($RNH_2$), secondary amines ($R_2NH$), and/or tertiary amines ($R_3N$) in which R is independently a saturated or unsaturated aliphatic, such as methyl, ethyl, propyl, vinyl, allyl, ethynyl, etc.; an alicyclic, such as cyclohexylmethyl; an aromatic, such as phenyl; a substituted hetero atom, such as oxygen, nitrogen, sulfur, etc.; or compounds in which the nitrogen atom is a member of a heterocyclic ring such as quinoline, pyrrolidine, or pyridine. In addition, any of the above amine compounds may be substituted with other hydrocarbon and/or hetero containing groups to form compounds such as diamines, amides, etc. Finally, it is also contemplated that compounds, which are converted to amines under the reactions conditions used, would function in an equivalent manner. For example, a compound such as an ammonium salt that yields an amine upon dissolution would provide the desired catalytic effect.

Examples of the amines that may be used herein include methylamine, ethylamine, butylamine, allylamine, cyclohexylamine, aniline, dimethylamine, diethylamide, dioctylamine, dibutylamine, methylethylamine, saccharin, piperidine, trimethylamine, triethylamine, pyridine, diethyl toluidene ethylmethylpropylamine, imidazole, choline acetate, triphenyl phosphene analine, trimethylsilylimidazole, ethylenediamine, diethylhydroxylamine, triethylenediamine, n-methylpyrolidone, etc.

The basic catalyst can generally be used at any concentration sufficient to catalyze hydrolysis of the Si—H bonds. Generally, concentrations of the basic catalyst can be from about 1 ppm to about 100 wt % based on the weight of the resin, depending on the basic catalyst.

The water used can be that present in the ambient environment (e.g., >about 25% relative humidity), the ambient environment can be supplemented with additional water vapor (e.g., relative humidity up to about 100%), water can be used as a liquid, or a compound which generates water under the reaction conditions can be used.

Contact of the SiH resin coating with the basic catalyst and water can be accomplished by any means practical or desirable. For instance, the SiH resin coating can be contacted with vapors of the basic catalyst and water vapor. Alternatively, the SiH resin coating can be contacted with the basic catalyst and water in the liquid state, such as by immersing the coating in an ammonium hydroxide solution.

The SiH resin coating is typically exposed to an environment comprising the basic catalyst and water in the vapor state, more typically ammonia and water vapor. For instance, the SiH resin coated substrate may be placed in a container and the appropriate environment introduced therein, or a stream of the basic catalyst and water may be directed at the SiH resin coating.

The method used to generate the basic catalyst and water environment is generally not significant in the present embodiment. Methods such as bubbling the basic catalyst (e.g., ammonia gas) through water or ammonium hydroxide solutions (to control the amount of water vapor present), heating a basic catalyst and water, or heating water and introducing the basic catalyst gas (e.g., ammonia gas) are all functional herein. It is also contemplated that methods, which generate basic catalyst vapors in situ, such as the addition of water to amine salts, or the addition of water to a silazane, such as hexamethyldisilazane, will also be effective.

The basic catalyst used may be at any concentration desired. For example, the concentration may be from about 1 ppm up to a saturated atmosphere.

The exposure can be at any temperature desired from room temperature up to about 300° C. A temperature in the range of from about 20° C. to about 200° C. is typical, with a range of from about 20° C. to about 100° C. being more typical.

The SiH resin coating should be exposed to the basic catalyst and water environment for the time necessary to hydrolyze the Si—H groups to form silanols (Si—OH) and for the silanols to at least partially condense to form Si—O—Si bonds. Generally, exposures of up to about 20 minutes are typical, with exposures of at least about 1 second up to about 5 minutes being more typical. If the coatings are to be used as a dielectric layer, it is generally typical to have a shorter exposure, as longer exposures tend to increase the dielectric constant of the coating.

When the coating is exposed to the basic catalyst and water in the liquid state, the exposure is usually conducted by immersing the coated substrate in a solution. Other equivalent methods can be used, such as flushing the coating with a basic catalyst and water solution. In addition, vacuum infiltration may also be used to increase penetration of the basic catalyst and water into the coating.

The basic catalyst solution used in this embodiment may be at any concentration desired. Generally when ammonium hydroxide is used, a concentrated aqueous solution of between about 28 and about 30% is typical since the duration of exposure is thereby shortened. When dilute solutions are used, the diluent is generally water.

Exposure to the basic catalyst and water solution in this embodiment may be conducted at any temperature and pressure desired. Temperatures from about room temperature (20–30° C.) up to about the boiling point of the basic catalyst solution, and pressures from below to above atmospheric are all contemplated herein. From a practical standpoint, it is typical that the exposure occur at about room temperature and at about atmospheric pressure.

The resin coating is exposed to the basic catalyst solution in this embodiment for the time necessary to hydrolyze the Si—H groups to form silanols (Si—OH) and for the silanols to at least partially condense to form Si—O—Si bonds. Generally, exposures of up to about 2 hours are typical, with exposures of at least about 1 second up to about 15 minutes being more typical.

Alternatively, the coating may be exposed to both a liquid basic catalyst and water environment (e.g., ammonium hydroxide) and a gaseous basic catalyst and water vapor environment (ammonia gas and water vapor). The exposures may be either sequential or simultaneous, and are generally under the same conditions as those described above.

After the resin is exposed to one of the above environments, the solvent is then removed from the coating.

This can be accomplished by any desired means, including but not limited to, heating the coating, and by vacuum. When the solvent is removed by heating the coating, condensation of the remaining silanols may be facilitated.

The coating produced by this process can be used as the starting material ("porous network coating") in the present invention. In a typical procedure to produce a porous network coating, a substrate is coated with the Si—H containing resin and solvent in a manner which ensures that at least about 5 volume % of the solvent remains in the coating. The coating is then exposed to the basic catalyst and water, and the solvent is evaporated.

Another method of making such a porous network coating is to thermally cure a siloxane resin containing large alkyl groups and to thermally decompose the alkyl groups to create porosity in the coating. As disclosed in U.S. Pat. Nos. 6,143,360 and 6,184,260, to Zhong, which are hereby incorporated herein by reference, hydridosilicon containing resin was allowed to contact with a 1-alkene comprising about 8 to about 28 carbon atoms in the presence of a platinum group metal-containing hydrosilation catalyst, effecting formation of an alkylhydridosiloxane resin where at least about 5 percent of the silicon atoms are substituted with at least one hydrogen atom, and the resulting resin was heated at a temperature sufficient to effect curing of the resin and thermolysis of alkyl groups from the silicon atoms, thereby forming a nanoporous silicone resin.

U.S. Pat. Nos. 6,232,424, 6,359,096 and 6,313,045, and U.S. pat. application Ser. No. 425,901 to Zhong et al., which are hereby incorporated herein by reference, disclose silicone resins and porous coatings made from the silicone resins. The silicone resins are made from a mixture compromising 15 to 70 mol % of tetraalkoxysilane, 12 to 60 mol % of an organosilane described by formula R'SiX$_3$, where R' is an hydrogen or alkyl group containing 1 to 8 carbon atoms, and 15 to 70 mol % of an organotrialkyoxysilane described by formula R"SI(OR''')$_3$, where R" is a hydrocarbon group compromising about 8 to 24 carbon atoms or a substituted hydrocarbon group compromising a hydrocarbon chain having about 8 to 24 carbon atoms.

U.S. patent application Ser. No. 09/951,819 entitled "SILICONE RESINS AND POROUS MATERIALS PRODUCED THEREFROM", to Zhong, filed Sep. 12, 2001 and hereby incorporated herein by reference, discloses porous coatings made from silicone resins having the general formula $(R^1SiO_{3/2})_x(HSiO_{3/2})_y$ where $R^1$ is an alkyl group having 8 to 24 carbon atoms. The coatings produced therein have a dielectric constant between 1.5 and 2.3. The above-referenced patent application further provides the following description of a porous low-k dielectric coating made in two steps from a resin with a formula of $(R^1SiO_{3/2})_x(HSiO_{3/2})_y$ where $R^1$ is 3,7,11,15-tetramethyl-3-hydroxy-hexadecyl.

U.S. patent application Ser. No. 09/951,899 entitled "SILICONE RESINS AND POROUS MATERIALS PRODUCED THEREFROM", to Zhong, filed Sep. 12, 2001 and hereby incorporated herein by reference, discloses porous coatings made from silicone resins having the general formula $(R^1SiO_{3/2})_u(HSiO_{3/2})_v(SiO_{4/2})_w(HOSiO_{3/2})_z$ where $R^1$ is a branched alkyl group having 8 to 24 carbon atoms containing at least one electron-withdrawing group in a pendant position on the alkyl chain; u has a value of 0.1 to 0.7; v has a value of 0.12 to 0.6; z≧0.5; w+z has a value of 0.15 to 0.7; and u+v+w+z=1.

Step 1. A resin sample was prepared by combining components (A), (B), (C), (D), (E), and (F) as described below in the amounts described in Table 1 of the above-referenced U.S. patent application:

(A) 0.45 mole parts of triethoxysilane, (B) 0.25 mole parts of an organotriethoxysilane, RSi(OR')$_3$ where R is 3,7,11,15-tetramethyl-3-hydroxy-hexadecyl, (C) 0.30 mole parts of tetraethoxysilane, and (D) a mixture of methyl isobutyl ketone (MIBK) and isobutyl isobutyrate (6:4 weight ratio), enough to make the concentration of the resulting resin 9%.

To this mixture was added a mixture of (E) water and (F) hydrogen chloride in the amounts described in Table 1 of the above-referenced U.S. patent application. The resulting reaction product was stripped of volatiles under reduced pressure at 60° C. until the solid content became 14 to 21%. Isobutyl isobutyrate was added to make the solid content 14%. The solution was then heated to reflux for 2 hours and water produced was removed continuously. The solvent was then changed to cyclohexanone by stripping off isobutyl isobutyrate and adding cyclohexanone.

Step 2. The resulting resin solution was spin-coated onto silicon wafers suitable for dielectric constant measurements and cured in a nitrogen flow at 440° C. for 1 hour. The dielectric constant was measured as 1.9. Alternatively, the curing of the spin-coated films may be accelerated with plasma and/or UV assisted processes.

U.S. patent application Ser. No. 09/915,899 to Albaugh et al., which is hereby incorporated herein by reference, discloses porous coatings from resins containing (RSiO$_{3/2}$)(R'SiO$_{3/2}$)(R"SiO$_{3/2}$) resins wherein R is an alkyl group having 1 to 5 carbon atoms or a hydrogen atom, R' is a branched alkoxy group and R" is a substituted or un-substituted linear, branched, or cyclic monovalent organic group having 6 to 30 carbon atoms.

U.S. patent application Ser. No. 915,903 to Boisvert et al., and U.S. Pat. No. 915,902 to Albaugh et al., which are hereby incorporated herein by reference, disclose porous coatings made from resins of the formula TRTR' where R is either a methyl or hydrogen group and a R' is a branched alkoxy group.

Although porous dielectric materials having low dielectric constants are desirable, it would be advantageous to have a porous dielectric material with a higher elastic modulus and film hardness.

In order to raise the elastic modulus of the porous dielectric material, it is exposed to a plasma cure. The plasma cure can be done by radio frequency (RF), inductive coupled, RF capacitive coupled, helical resinator, microwave downstream, and microwave electron cyclotron resonance (ECR) plasma. The plasma curing process improves the mechanical properties of the porous low-k dielectric material, increasing material hardness while maintaining the dielectric pore, structure, density, and electrical properties.

In a typical plasma curing process, the wafer is quickly heated in a rapid temperature ramp-up step to the desired temperature, and the wafer is plasma cured.

The exact conditions for the plasma cure depend upon what type of plasma cure is being used. Typically, the porous dielectric material is plasma cured at a process pressure between about 1 Torr and about 10 Torr. Examples of typical microwave plasma cure conditions for 200 mm and 300 mm wafers are shown below.

| Condition | 200 mm system | 300 mm system |
|---|---|---|
| Microwave Plasma Power: | 500 W–3000 W | 500 W–3000 W |
| Wafer Temperature: | 80° C.–350° C. | 80° C.–350° C. |
| Process Pressure: | 1.0 Torr–4.0 Torr | 1.0 Torr–5.0 Torr |
| Plasma Cure Time: | <120 seconds | <120 seconds |
| Plasma Gases: | $H_2/N_2/CF_4/O_2$ | $H_2/N_2/CF_4/O_2$ |
| $N_2H_2$ Flow Rate: | >0–4000 sccm | >0–10,000 sccm |
| $O_2$ Flow Rate: | >0–4000 sccm | >0–10,000 sccm |
| $CF_4$ Flow Rate: | >0–400 sccm | >0–1000 sccm |

The elastic modulus and film hardness of the plasma cured porous dielectric materials are increased as compared to a furnace (thermally) cured porous dielectric material. The furnace cured elastic modulus is between about 0.5 GPa and about 3.5 GPa when the dielectric constant is between 1.6 and 2.4. This increase in the elastic modulus is typically greater than or about 50%, more typically greater than or about 100%, and more typically greater than or about 200%. Typically, the elastic modulus of the plasma cured porous dielectric material is greater than or about 2.0 GPa, and more typically between about 2.5 GPa and about 10 GPa. The film hardness of the furnace cured porous films is about 0.1 GPa and the increase in the film hardness is typically greater than or about 50%. Typically, the film hardness of the plasma cured porous dielectric material is greater than or about 0.25 GPa, and more typically between about 0.25 GPa and 0.8 GPa.

The plasma cured porous dielectric materials of the present invention have improved chemical stability and improved dimensional stability. By improved chemical stability, we mean that the porous dielectric materials are more resistant to chemicals, such as cleaning solutions and chemical polishing solutions, and plasma damaging during photoresist ashing and dry etching processes.

In addition, as compared to thermal curing, the plasma cure significantly reduces or eliminates the outgassing of oliomeric polysilica and other substances from the porous films. However, plasma cure can for some low-k materials, generate a notable amount of polar species in the film.

The plasma cured porous dielectric materials can optionally be post-plasma treated using any type of thermal and/or UV and/or plasma exposure to reduce the dielectric constant and/or further increase the elastic modulus and film hardness, if desired. For example, the plasma cured porous dielectric materials can be annealed by placing the materials in a conventional oven until the polar species are removed, such as at a temperature of between about 400° C. and about 450° C. for between about 30 and about 60 minutes. An alternative process for annealing the materials involves annealing the plasma cured porous dielectric materials in a Rapid Anneal Processing (RAP) chamber in order to reduce the dielectric constant. The plasma cured porous dielectric material is annealed at a typical temperature for a sufficient time, and cooled to about 100° C. However, RAP may not be necessary in some applications.

Typical operating conditions for the RAP process are shown below.

| Ramp rate: | 15–150° C./sec |
|---|---|
| Wafer Temperature: | 150–450° C. |
| Annealing Time: | <120 seconds |
| Process Pressure: | atmospheric |

A third type of post-plasma treatment that can be used involves the exposure of the plasma cured porous dielectric materials to UV radiation at elevated temperatures. In a typical post-plasma UV process, a UV radiator tool is utilized, which is first purged with nitrogen or argon to allow the UV radiation to enter the process chamber with minimal spectral absorption. The process chamber is purged separately and process gases, such as $O_2$, $N_2$, $H_2$, Ar, He, $C_xH_y$, air, and mixtures thereof, may be utilized for different applications. UV generating bulbs with different spectral distributions may be selected depending on the application. The wafer temperature may be controlled ranging from room temperature to 450° C., and the process pressure can be less than, greater than, or equal to atmospheric pressure.

Examples of typical post-plasma UV treatment conditions for a 200 mm wafer are shown below.

| UV Power: | 0 mW–320 mW |
|---|---|
| Wafer Temperature: | 100° C.–450° C. |
| Process Pressure: | <, >, or = to atmospheric |
| UV Cure Time: | <300 seconds |
| Purge Gases: | $H_2/N_2/C_xH_y/O_2$ |

A fourth type of post-plasma treatment that can be used involves the exposure of the plasma cured porous dielectric materials to a second plasma condition at elevated temperatures. In a typical plasma-assisted post-plasma treatment, process gases, such as $O_2$, $N_2$, $H_2$, Ar, He, $C_xH_y$, fluorine-containing gas, and mixtures thereof, may be utilized for different applications. The wafer temperature may be controlled ranging from room temperature to 450° C. Typically, the plasma cured porous dielectric material is plasma treated at a process pressure between about 1 Torr and about 10 Torr. Examples of typical plasma-assisted post-plasma treatment conditions for 200 mm and 300 mm wafers are shown below.

| Condition | 200 mm system | 300 mm system |
|---|---|---|
| Microwave Plasma Power: | 500 W–3000 W | 500 W–3000 W |
| Wafer Temperature: | 80° C.–350° C. | 80° C.–350° C. |
| Process Pressure: | 1.0 Torr–3.0 Torr | 1.0 Torr–4.0 Torr |
| Plasma Treatment Time: | <90 seconds | <90 seconds |
| Plasma Gases: | $H_2/N_2/CF_4/O_2/Ar/He/C_xH_y$ | $H_2/N_2/CF_4/O_2/Ar/He/C_xH_y$ |
| $N_2H_2$ Flow Rate: | >0–4000 sccm | >0–10,000 sccm |
| $O_2$ Flow Rate: | >0–4000 sccm | >0–10,000 sccm |
| $CF_4$ Flow Rate: | >0–400 sccm | >0–1000 sccm |
| Ar Flow Rate: | >0–4000 sccm | >0–10,000 sccm |
| He Flow Rate: | >0–4000 sccm | >0–10,000 sccm |

The dielectric constant of the post-plasma treated, plasma cured porous dielectric materials is reduced as compared to the plasma cured porous dielectric materials. The dielectric constant of the post-plasma treated, plasma cured porous dielectric materials is typically between about 1.1 and about 3.5, and more typically between about 1.8 and about 2.4.

For some applications it is desirable to utilize the plasma for a partial conversion of the porous low-k films. The partial conversion process allows to control the material properties of the porous low-k films, such as Young's modulus, film hardness, hydrophobicity. and dielectric constant, as well as the Si—H, Si—OH, and/or Si—$CH_3$ contents of the porous low-k film. Different partial conversion conditions are achieved by utilizing different plasma cure conditions, such as time, pressure, temperature, and plasma gas composition. For HSQ-based porous low-k films, typical partial plasma conversion processes result in films that have a Si—H content of between more than 0% and less than or about 70%, and more typical between about 1% and about 30%.

In order that the invention may be more readily understood, reference is made to the following examples, which are intended to illustrate the invention, but not limit the scope thereof.

EXAMPLE 1

A porous low-k dielectric material with a composition of approximately 5% MSQ resin and 95% HSQ resin from Dow Corning Corporation (Midland, Mich.) has been plasma cured. An Axcelis Fusion (ES) downstream plasma asher was utilized, but is not limiting to the plasma curing applicability of this invention. Typical process conditions for the plasma cure in the 200 mm wafer platform tool range from forming gas flows of 2000 to 3000 sccm, $CF_4$ flows of 0 to 100 sccm, pressures of 1.0 to 4.0 Torr, microwave powers of 500 to 3000 W, and temperatures ranging from 150 to 300° C.

The rapid anneal process (RAP) step was performed at temperatures ranging from 400 to 450° C. in a nitrogen environment for up to 120 seconds. Successful plasma curing results have been obtained from (i) blanket porous low-k thin films with thickness ranging from 4000 to 15000 Å, and (ii) patterned porous low-k structures.

Typical material properties of the porous low-k dielectric constant films that have been plasma cured are shown in Table 1 below.

TABLE 1

5% MSQ / 95% HSQ Porous Low-K Material Plasma Process Conditions and Material Characteristics

| Time | Temp | Pressure | Power | FG | CF4 |
|---|---|---|---|---|---|
| MIN | 285 | p | X | 2000 | CF4 |
| 90 | 285 | p | 1800 | 2000 | CF4 |

| | | | THICKNESS DATA | | | Reflective Index | | | | |
|---|---|---|---|---|---|---|---|---|---|---|
| Process Cond. | p | CF4 | Before RAP | After RAP | Δ | Before RAP | After RAP | Δ | E (GPa) | Contact Angle (°) |
| 1 | 3.5 | 100 | 4312 | 3909 | −403 | 1.193 | 1.195 | 0.002 | 8.2 | 97 |
| 2 | 4 | 100 | 4237 | 3936 | −301 | 1.193 | 1.198 | 0.005 | 7.1 | 109 |
| 3 | 3 | 10 | 4311 | 3649 | −662 | 1.190 | 1.241 | 0.051 | 12.5 | 69 |

EXAMPLE 2

A porous low-k dielectric material with inorganic-organic hybrid resins from Dow Corning Corporation (Midland, Mich.) that is synthesized with the porogen method has been plasma cured. An Axcelis Fusion (ES) downstream plasma asher was utilized, but is not limiting to the plasma curing applicability of this invention. Typical process conditions for the plasma cure in the 200 mm wafer platform tool range from forming gas flows of 2000 to 3000 sccm, $CF_4$ flows of 0 to 100 sccm, pressures of 1.0 to 4.0 Torr, microwave powers of 500 to 3000 W, and temperatures ranging from 150 to 350° C.

Successful plasma curing results have been obtained from blanket porous low-k thin films with thickness of approximately 12,000 Å. Typical material properties of the porous low dielectric constant films that have been plasma cured are shown in Table 2 below.

TABLE 2

Inorganic-Organic Hybrid Porogen Generated Porous Low-K Material Plasma Process Conditions and Material Characteristics.

| Time | Temp | Pressure | Power | FG | CF4 |
|---|---|---|---|---|---|
| MIN | T | p | X | 3000 | 10 |
| 60 | T | p | 1800 | 3000 | 10 |

| | | | THICKNESS DATA | | Reflective Index | | | |
|---|---|---|---|---|---|---|---|---|
| Process Cond. | p | T | Before Plasma | After Plasma | Before Plasma | After Plasma | k | E (GPa) | Contact Angle (°) |

TABLE 2-continued

Inorganic-Organic Hybrid Porogen Generated Porous Low-K Material
Plasma Process Conditions and Material Characteristics.

| 1 | 1 | 210 | 11953 | 10424 | 1.223 | 1.218 | 2.04 | 2.0 | 72 |
| 2 | 3 | 210 | 11905 | 9783 | 1.223 | 1.209 | 2.35 | 2.5 | 61 |
| 3 | 1 | 180 | 11878 | 10760 | 1.224 | 1.193 | 1.95 | 2.0 | 59 |
| 4 | 3 | 180 | 11902 | 9991 | 1.225 | 1.207 | 2.35 | 2.3 | 54 |
| control | | | | | | | 1.95 | 0.9 | 89 |

EXAMPLE 3

Subsequent annealing of the films may further increase the elastic modulus and film hardness. Different anneal conditions, including (i) Rapid Anneal Processing (RAP) at 450° C. for 2 minutes, (ii) furnace anneal at 200° C. for 30 minutes, and (iii) furnace anneal at 400° C. for 30 minutes have been tested. Typical material properties of the porous low dielectric constant films that have been plasma cured and annealed are shown in Table 3 below.

TABLE 3

| | | Pre-RAP | | | | Post-RAP | | | | |
|---|---|---|---|---|---|---|---|---|---|---|
| Piece | Treatment | Thickness | R.I. | Modulus | Hardness | Thickness | R.I. | Modulus | Hardness | k |
| 1 | 30 minutes at 200° C. | 9331 | 1.248 | 2.4 | 0.26 | 10176 | 1.2012 | 2.6 | 0.32 | 2.436 |
| 2 | 30 minutes at 400° C. | 9445 | 1.240 | 2.5 | 0.30 | 8365 | 1.2771 | 3.1 | 0.34 | 1.951 |
| 3 | 2 minutes at 450° C. | 9516 | 1.239 | 2.4 | 0.29 | 8853 | 1.2418 | 3.2 | 0.33 | 1.990 |

EXAMPLE 4

A porous HSQ-resin-based low-k dielectric from Dow Corning Corporation (Midland, Mich.) has been plasma cured with different partial conversion conditions. An Axcelis Fusion (ES) downstream plasma asher was utilized, but is not limiting to the plasma curing applicability of this invention. Typical process conditions for the plasma cure in the 300 mm wafer platform tool range from forming gas flows of 4000 to 8000 sccm, $CF_4$ flows of 0 to 500 sccm, pressures of 1.0 to 5.0 Torr, microwave powers of 500 to 3000 W, and temperatures ranging from 150 to 300° C.

The rapid anneal process (RAP) step was performed at temperatures ranging from 400 to 450° C. in a nitrogen environment for up to 120 seconds. Successful partial conversion plasma curing results have been obtained from (i) blanket porous low-k thin films with thickness ranging from 4000 to 15000 Å, and (ii) patterned porous low-k structures.

Typical material properties of the porous low dielectric constant films that have been plasma cured are shown in Table 4 below.

TABLE 4

HSQ Porous Low-K Material Plasma Partial Conversion Process
Conditions and Material Characteristics

| Time | Temp | Pressure | Power | 3% H2/N2 | CF4 | Post-Plasma Process |
|---|---|---|---|---|---|---|
| MIN time | T | 4.5 | X | 5000 | 250 | RTP: 450° C., 2 min, N2 purge DCC system |
| | T | 4.5 | 1500 | 5000 | 250 | |

TABLE 4-continued

HSQ Porous Low-K Material Plasma Partial Conversion Process
Conditions and Material Characteristics

| RUN | Time (s) | Temp (° C.) | Modulus (GPa) | k after plasma | k after anneal | SiH (%) |
|---|---|---|---|---|---|---|
| A | 40 | 190 | 3.4 | 2.6 | 2.52 | 13 |
| B | 50 | 190 | 4.2 | 2.36 | 2.25 | 5.5 |
| C | 60 | 190 | 4.6 | 2.47 | 2.29 | 0.93 |
| D | 40 | 210 | 4.1 | 2.47 | 2.47 | 12.5 |
| E | 50 | 210 | 4.7 | 2.36 | 2.46 | 6.4 |
| F | 60 | 210 | 5.4 | 2.36 | 2.32 | 1.25 |
| G | 40 | 230 | 4.9 | 2.48 | 2.52 | 11.4 |
| H | 50 | 230 | 6 | 2.53 | 2.54 | 6.39 |
| I | 60 | 230 | 6.5 | 2.44 | 2.41 | 1.81 |

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A process for making a plasma cured material from an uncured porous dielectric material comprising:
   providing the uncured porous dielectric material produced by a spin-on process, the material having a first dielectric constant, having a first elastic modulus, and having a first hardness, wherein
   the porous dielectric material is selected from a hydrogen silsesquioxane dielectric material or a mixed hydrogen silsesquioxane/methylsilsesquioxane dielectric material, and
   the porous dielectric material is not a porous methylsilsesquioxane-based dielectric material;

exposing the uncured porous dielectric material to a plasma; and plasma curing the uncured porous dielectric material to produce a plasma cured porous dielectric material having a second dielectric constant which is substantially equal to the first dielectric constant, having a second elastic modulus which is greater than the first elastic modulus, and having a second hardness which is greater than the first hardness.

2. The process of claim 1 wherein the porous dielectric material is selected from a porogen-generated porous dielectric material, a solvent-based porous dielectric material, a molecular engineered porous dielectric material, or a combination thereof.

3. The process of claim 1 wherein the porous dielectric material is plasma cured at a temperature between about 80° C. and about 350° C.

4. The process of claim 1 wherein the porous dielectric material is plasma cured at a temperature between about 150° C. and about 300° C.

5. The process of claim 1 wherein the porous dielectric material is plasma cured at a process pressure between about 1 Torr and about 10 Torr.

6. The process of claim 1 wherein the porous dielectric material is plasma cured for a time between about 15 and about 120 seconds.

7. The process of claim 1 wherein the plasma gas is selected from $H_2$ plasma gas, $N_2$ plasma gas, fluorine-containing plasma gas, $O_2$ plasma gas, or combinations thereof.

8. The process of claim 1 wherein the increase in elastic modulus between the first elastic modulus of the porous dielectric material and the second elastic modulus of the plasma cured porous dielectric material is greater than or about 50%.

9. The process of claim 1 wherein the increase in elastic modulus between the first elastic modulus of the porous dielectric material and the second elastic modulus of the plasma cured porous dielectric material is greater than or about 100%.

10. The process of claim 1 wherein the second elastic modulus of the plasma cured porous dielectric material is greater than or about 2.0 GPa.

11. The process of claim 1 wherein the second elastic modulus of the plasma cured porous dielectric material is between about 2.5 GPa and about 10 GPa.

12. The process of claim 1 wherein the increase in hardness between the first hardness of the porous dielectric material and the second hardness of the plasma cured porous dielectric material is greater than or about 50%.

13. The process of claim 1 wherein the second hardness of the plasma cured porous dielectric material is greater than or about 0.25 GPa.

14. The process of claim 1 wherein the second hardness of the plasma cured porous dielectric material is between about 0.25 GPa and about 0.8 GPa.

15. The process of claim 1 further comprising post-plasma treating the plasma cured porous dielectric material to provide a post-plasma treated, plasma cured porous dielectric material having a third dielectric constant which is less than or about equal to the second dielectric constant, having a third elastic modulus which is greater than or about equal to the second elastic modulus, and having a third hardness which is greater than or about equal to the second hardness.

16. The process of claim 15 wherein the third dielectric constant of the post-plasma treated, plasma cured porous dielectric material is between about 1.1 and about 3.5.

17. The process of claim 15 wherein the third dielectric constant of the post-plasma treated, plasma cured porous dielectric material is between about 1.8 and about 2.4.

18. The process of claim 15 wherein the post-plasma treating is annealing.

19. The process of claim 18 wherein the plasma cured porous dielectric material is annealed at a temperature less than or about 450° C.

20. The process of claim 18 wherein the plasma cured porous dielectric material is annealed at a temperature between about 150° C. and about 450° C.

21. The process of claim 18 wherein the plasma cured porous dielectric material is annealed for no more than or about 60 minutes.

22. The process of claim 15 wherein the post-plasma treating is UV treating by exposing the plasma cured porous dielectric material to UV radiation at elevated temperatures.

23. The process of claim 22 wherein the plasma cured porous dielectric material is UV treated at a UV power between greater than 0 and about 1000 mW/cm2.

24. The process of claim 22 wherein the plasma cured porous dielectric material is UV treated at a temperature between about 100° C. and about 300° C.

25. The process of claim 22 wherein the plasma cured porous dielectric material is UV treated for no more than or about 300 seconds.

26. The process of claim 22 wherein the plasma cured porous dielectric material is UV treated at a process pressure that is less than or about equal to atmospheric pressure.

27. The process of claim 22 wherein the plasma cured porous dielectric material is UV treated with a gas purge, wherein the gas is selected from $H_2$, $N_2$, $O_2$, Ar, He, air, or combinations thereof.

28. The process of claim 15 wherein the post-plasma treating is plasma treating by exposing the plasma cured porous dielectric material to a second plasma condition at elevated temperatures.

29. The process of claim 28 wherein the plasma cured porous dielectric material is plasma treated at a plasma power between about 500 W and about 3000 W.

30. The process of claim 28 wherein the plasma cured porous dielectric material is plasma treated at a temperature between about 100° C. and about 450° C.

31. The process of claim 28 wherein the plasma cured porous dielectric material is plasma treated for no more than or about 90 seconds.

32. The process of claim 28 wherein the plasma cured porous dielectric material is plasma treated at a process pressure between about 1 Torr and about 10 Torr.

33. The process of claim 28 wherein the plasma cured porous dielectric material is plasma treated with a plasma gas, wherein the plasma gas is selected from $O_2$, $N_2$, $H_2$, Ar, He, fluorine-containing gas, or a combination thereof.

34. The process of claim 22 wherein the plasma cured porous dielectric material is UV treated at a process pressure that is greater than or about equal to atmospheric pressure.

* * * * *

UNITED STATES PATENT AND TRADEMARK OFFICE
CERTIFICATE OF CORRECTION

PATENT NO.    : 6,913,796 B2
DATED         : July 5, 2005
INVENTOR(S)   : Albano et al.

It is certified that error appears in the above-identified patent and that said Letters Patent is hereby corrected as shown below:

Column 17,
Line 12, "a solvent-based porous" should read -- a solvent-formed porous --.
Line 27, "wherein the plasma gas is" should read -- wherein the plasmas is --.

Signed and Sealed this

Fourth Day of April, 2006

JON W. DUDAS
*Director of the United States Patent and Trademark Office*